United States Patent [19]

Tu et al.

[11] Patent Number: 4,846,949
[45] Date of Patent: Jul. 11, 1989

[54] HIGH RESISTIVITY CHROMIUM SILICIDE FILMS

[75] Inventors: Yue-Tung Tu, Fremont; Martin P. Rosenblum, Menlo Park; Elliot V. English, Livermore, all of Calif.

[73] Assignee: Southwall Technologies, Palo Alto, Calif.

[21] Appl. No.: 115,239

[22] Filed: Oct. 30, 1987

[51] Int. Cl.$^4$ .............................................. C23C 14/34
[52] U.S. Cl. ......................... 204/192.21; 204/192.14; 204/192.23
[58] Field of Search ....................... 204/192.14, 192.21, 204/192.23, 192.3

[56] References Cited

U.S. PATENT DOCUMENTS

| | | | |
|---|---|---|---|
| 4,364,792 | 12/1982 | Gliem et al. | 156/628 |
| 4,466,874 | 8/1984 | Belke, Jr. et al. | 204/192.14 |
| 4,569,742 | 2/1986 | Schuetz | 204/192.21 |
| 4,627,902 | 12/1986 | Johnston et al. | 204/192.21 |

OTHER PUBLICATIONS

S. Schiller et al. *Thin Solid Films,* vol, 96, pp. 279–284, (1982).

*Primary Examiner*—Aaron Weisstuch
*Attorney, Agent, or Firm*—Irell & Manella

[57] ABSTRACT

High resistivity chromium silicide coatings that are chemically, physically, and electrically stable at high temperatures are provided. The coatings are applied to substrates, optionally over a barrier layer of dielectric. The coatings are deposited in a magnetron sputtering process involving sputtering of a CrSi$_2$ target in the presence of a gaseous mixture that includes nitrogen. The coatings so provided typically have resistivities on the order of 100 to 20,000 ohms per square. The degree of nitrogen incorporation varies with the thickness of the chromium silicide to give selected ranges of stable products.

16 Claims, No Drawings

4,846,949

HIGH RESISTIVITY CHROMIUM SILICIDE FILMS

BACKGROUND

1. Field of the Invention

This invention relates generally to high resistivity films and coatings, and more particularly relates to high resistivity chromium silicide films and coatings deposited by sputtering.

2. Description of the Prior Art

High resistivity coatings that are chemically and physically stable over a wide range of temperatures are useful in a number of applications. Such coatings can be used, for example, in impedance matching applications as well as in the fabrication of resistive elements in thin film integrated circuit structures. In addition to high resistivity, in the aforementioned applications, it is also desirable to provide films which (1) can withstand the chemicals and high temperatures used in integrated circuit fabrication processes and other fabrication processes and (2) can be deposited in such a way as to minimize cracking and delamination. In addition, in many applications it is important that the films be electrically stable, that is, they exhibit constant resistivities even after prolonged heating as may occur in use or in processing.

To this end, several attempts have been made at providing stable, high resistivity films and coatings. Early attempts involved sputter deposition of tantalum nitride, copper-germanium alloys and Nichrome (an alloy containing nickel, chromium and iron; "Nichrome" is a trademark of Driver-Harris Co., Harrison, N.J. While coatings of sufficient thickness to eliminate problems with cracking and delamination have been prepared by sputter deposition of these materials and are in fact useful in some applications, the relatively low rsistivity obtained in each case is a limiting factor for many other applications. With Nichrome, for example, coherent films are stable only up to about 200 ohms per square.

The method of this invention provides films of much higher resistivity than previously obtained, even at thicknesses on the order of several thousand angstroms, which films are also chemically, physically, and electrically stable over a wide range of temperatures. The films are deposited by reactive sputtering of a $CrSi_2$ target. While a large number of patents disclose the use of magnetron sputtering in the formation of various types of films and coatings, we are not aware of any that teach or suggest a process for forming temperature-stable high resistivity films. As representative examples:

U.S. Pat. No. 4,513,905 to Nowicki et al. shows a process for sputter depositing a protecting, "barrier" layer of chromium or titanium on a layer of silicon. The process involves reactive sputtering in a partial atmosphere of nitrogen.

U.S. Pat. No. 4,461,799 to Gavrilov et al., in the context of providing wear-resistant coatings on cutting tools, discloses successively depositing on an aluminum oxide or ceramic base (1) a pure metal and (2) a carbide or nitride of titanium or zirconium.

U.S. Pat. No. 3,257,305 to Varga discloses the use of sputtering to form tantalum oxide coatings on semiconductor substrates.

U.S. Pat. No. 4,131,530 to Blum et al. discloses a method of sputter depositing a crack-resistant coating on a plastic substrate. The target is primarily comprised of chromium and iron. The primary advantage of the process, in the context of providing automobile trim, is stated to be the improved resistance to sunlight and water.

U.S. Pat. No. 4,337,990 to Fan et al. shows a transparent thermal barrier formed from composite films. In a preferred embodiment, titanium oxide is sputter deposited on either side of a metallic silver film.

U.S. Pat. No. 4,219,608 to Nishiyama et al. discloses high resistivity piezoelectric crystalline films made by sputtering zinc oxide and sulfur, selenium or tellurium. The process is directed to the issue of obtaining a particular crystalline orientation within the piezoelectric films.

U.S. Pat. No. 4,252,865 to Gilbert et al. discloses a solar-energy device having a sputter-deposited coating of an amorphous semiconductor material such as germanium.

U.S. Pat. No. 4,113,599 to Gillery shows sputter deposition of indium oxide, tin oxide, or indiumtin oxide films on glass. The sputtering is reactive is that it is carried out in the presence of oxygen gas.

U.S. Pat. 3,574,143 to Vratny discloses preparation of a "resistive composition" by sputtering hafnium compounds in the presence of nitrogen.

SUMMARY OF THE INVENTION

Accordingly, it is a primary object of the present invention to overcome the aforementioned disadvantages of the prior art.

It is another object of the invention to provide a process of preparing high resistivity chromium silicide films which are chemically, physically, and electrically stable over a wide range of temperatures.

It is still another object of the invention to provide such a method using reactive sputtering.

It is a further object of the invention to provide such a method in which a heat-stable high resistivity chromium silicide film is provided on a heat-stable plastic substrate such as a polyimide.

It is still a further object of the invention to provide thermally stable high resistivity chromium silicide films having a resistivity of 100 ohms per square or greater.

It is yet a further object of the invention to provide high stability-high resistivity chromium silicide films on a heat-stable plastic substrate wherein one or more underlayers (and optionally, overlayers), are provided as well, the underlayers or overlayers comprised of one or more chemically compatible, heat-stable, dielectric materials.

Additional objects, advantages and novel features of the invention will be set forth in part in the description which follows, and in part will become apparent to those skilled in the art on examination of the following, or may be learned by practice of the invention.

In accord with the invention, a new class of stable chromium silicide films is provided. The films are nitrided chromium silicide films. The resistivity of these films is determined (1) by film thickness and (2) by the degree of incorporation of nitrogen during film formation by reactive sputtering. For each thickness in the range of about 100 angstroms to about 5000 angstroms, there exists an optimal range of nitrogen incorporation which gives heat-stable, high-resistivity films. These products can have stable sheet resistivities of from about 100 ohms per square to about 20,000 ohms per square.

These films can be laid down on substrates, such as flexible plastic substrates or the like, to give resistive products. In some embodiments, these resistive products additionally include a dielectric barrier layer between the film and the substrate.

In another aspect of the invention, the films are formed by magnetron sputtering of a $CrSi_2$ target in the presence of a controlled amount of added nitrogen.

In still another aspect of the invention, a process for preparing preferred embodiments comprises: (1) depositing a first or barrier layer on a heat-stable substrate by a sputtering process using a dielectric first target; and (2) depositing a second layer over the first layer by magnetron sputtering of a $CrSi_2$ second target in the presence of a controlled amount of added nitrogen. The thickness of the optional first layer is such as to provide a continuous barrier between the plastic substrate and the chromium silicide resistive layer, e.g., at least about 100 angstroms. The thickness of the chromium silicide layer is at least about 250 angstroms.

Preferred products have a heat-stable substrate, for example, a flexible plastic sheet or fabric substrate such as can be formed from polyimide or the like; a first layer of sputter-deposited dielectric and over the first layer a second layer of nitrogen-modified chromium silicide, the second layer having been sputter-deposited in the presence of a controlled amount of added nitrogen. The second layer is a relatively conductive layer which has a resistance of at least 100 to 20,000 ohms per square and the first layer has a resistance at least ten times that of the second layer.

DETAILED DESCRIPTION OF THE INVENTION

1. Definitions

"Sputter deposit" or "sputter deposited" refers to the process or the product of the process in which a layer of material is laid down by use of a magnetron sputterer. This is a known commercial process which is described in references such as S. Schiller, U. Heisig and K. Goedicke, Thin Solid Films, 54 (1978) 33; R. K. Waits, in J. L. Vossen and W. Kern (eds.), Thin Film Processes, Academic Press, New York, 1978, p. 131; J. A. Thornton and A. S. Penfold, in J. L. Vossen and W. Kern (eds.), Thin Film Processes, Academic Press, New York, 1978; and D. B. Fraser, in J. L. Vossen and W. Kern (eds.), Thin Film Processes, Academc Press, New York, 1978, which are incorporated herein by reference.

"Reactive sputter deposit" or "reactive sputtering" refers to a sputter deposit process in which a reactive gas (in the present case, a nitrogen-containing gas) is intentionally added to the plasma zone of a magnetron sputterer during the deposition process.

A 'chromium silicide' coating as used herein is intended to mean a coating formed by magnetron sputtering of a $CrSi_2$ target having a purity of at least about 99.5 wt.%, preferably at least about 99.95 wt.%. The coating thus formed, while comprised of chromium and silicon, is not necessarily stoichiometrically equivalent to $CrSi_2$ since during deposition of the layer in a partially nitrogenous atmosphere, nitrogen is incorporated into the film as well. Thus, "chromium slicide" coatings are intended to include all coatings containing chromium and silicon as prepared by the present method.

"Ohms per square" refers to a value for the electrical sheet resistivity of material measured by a four point probe method as known in the art.

"Thermally stable high resistivity film" or "heat stable high resistivity film" or the like as used herein refers to a resistor film which has a resistivity of at least 100 ohms per square and which exhibits a drift in resistance of less than 3%, and preferably less than 2%, when heated for 100 hours at 150° C.

A "heat stable substrate" is a plastic substrate capable of withstanding prolonged exposure (at least two hours) at 150° C. and preferably 200° C. without substantial change or degradation of properties.

2. Overview of the Products

The high-resistivity chromium silicide films alone are extremely fragile—being only several hundreds or thousands of angstroms in thickness. Accordingly, products including these films must also include a heat-stable substrate for support. In many cases, the products produced hereby have at least three components—a heat-stable substrate, a first or barrier layer of dielectric and a second layer of chromium silicide, said second layer having been laid down by sputtering of $CrSi_2$ in the presence of added nitrogen.

THE SUBSTRATE

The substrate is a heat-stable, dimensionally stable solid which can withstand sputtering conditions. It can be a rigid body, if desired, but more typically is a two-dimensional sheet-like or fabric-like structure. Preferably it is flexible. It must be heat stable.

Typical flexible substrates are the polyimides, polysulfones, polyethersulfones, polyether ether ketones, and the like. The polyimides are found by the condensation of an aromatic dianhydride, such as pyromellitic anhydride with an aromatic diamine such as 4,4"-diaminodiphenylether. Amide groups can be incorporated as well but may tend to degrade the desired stability property. Polyimide film ranging in the thickness from about 0.5 mils to about 25 mils are available commercially as Kapton and are preferred. ("Kapton" is a trademark of E.I. DuPont de Nemours & Co., Wilmington, Del.)

Polysulfones are materials containing —$SO_2$—groups in their main chains. Typical structures for pulysulfones are as follows:

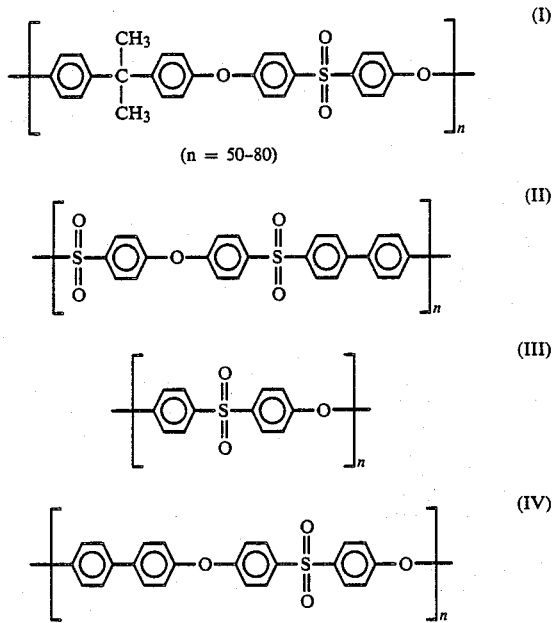

wherein I is a basic polysulfone, II is a polyarylsulfone, III is a polyethersulfone and IV is a polyphenylsulfone, Of these, the polyethersulfone materials of III are preferred.

THE FIRST OR BARRIER LAYER

Many products which incorporate the high resistivity chromium silicide also have a first or barrier layer applied between the substrate and the resistive layer. Although not understood with certainty, it appears that some substrates may contain moisture or other materials which outgas during deposit of the chromium silicide and interfere with the proper and consistent lay down and properties of the resistive layer. Similarly, this outgassing may interfere with the stability of the product at high temperatures. This barrier layer overcomes the aforementioned problems.

In selecting the barrier layer it should be recognized that this layer, if conductive, would in effect create a circuit in parallel with the resistive layer. Thus, its conductivity should be no more than about 10% of that of the resistive layer. Preferably its conductivity is less than 1% of that of the resistive layer.

Good barrier materials are the dielectrics having a bulk resistivity of greater than 5 ohm centimeters. Typical materials are silicon, silicon oxide, germanium, alumina, titanium oxide, silicon oxide-titanium oxide, silicon-germanium, indium-tin oxide, and the like. Silicon has given excellent results as a barrier layer and on that basis is preferred.

The barrier layer, if present, is typically at least about 100 angstroms in thickness, preferably at least about 300 angstroms, and, for use with most commercial equipment, is at least about 1000 angstroms thick. Of course, thicker layers could be used so long as the conductivity requirements are not exceeded and the physical properties of the layer (flexibility, etc.) are consistent with those of the substrate.

The first layer is generally deposited by sputtering technologies -- either RF sputtering or magnetron sputtering with magnetron sputtering being preferred.

THE RESISTIVE LAYER

The products contain a high resistivity layer which exhibits exceptional thermal stability. This layer is composed of chromium silicide as that term is defined herein. This layer has a resistivity of at least 100 ohms per square and can have resistivities as high as 20,000 ohms per square.

The resistivity of the chromium silicide film is related to its thickness as well as to the amount of nitrogen incorporated into the film. The resistivity is inversely related to thickness, while when nitrogen is added, the resistivity of the layer increases in direct proportion to the amount added.

First with regard to the thickness, the thinnest mechanically coherent films which may be practically prepared from chromium silicide are about 300 angstroms. The thickest films conveniently laid down with conventional magnetron sputtering equipment are about 6000 angstroms. Excellent results are achieved with thicknesses in the range of about 500 to about 3000 angstroms.

By adding nitrogen, the resitivity of these chromium silicide films is increased. (When no nitrogen is present, chromium silicide has a resistivity of 18-22 ohms per square at a thickness of 2000-2500 angstroms or a resistivity of about 80 ohmns per square at a thickness of about 500 angstroms.) If any of these films are exhaustively nitrided, their reistance becomes immeasurably large. This would suggest that one could obtain any resistance from any thickness of film. However, this is not the case when thermally stable resistive films are desired. With thin films, i.e., of about 300-750 angstroms, stability is achieved when the degree of nitridation is very modest (giving rise to an increase in resistivity from the measured no-nitrogen value to a value of about 1.1 to 1.3 times that value). With films of 2000-2500 angstroms, stability is achieved at much higher degrees of nitridation, i.e., so as to give 30-40 fold increases in resistivity. This leads to the unexpected finding that lowest resistance, stable films, e.g., 100 ohms per square, are most easily achieved with the thinnest layers, 500-750 angstroms, and higher resistance films are achieved with thicker layers (for example, stable, 750 ohms per square films can be achieved with 1800-2200 angstrom materials). The degrees of nitridation for other thicknesses may be extrapolated from these values. In all cases, there is a limited range of stable resistivities for any given film thickness. Thus, final resistivities can be finely tuned within these ranges by altering the accurately controlled degree of nitrogen addition. The present invention enables fabrication of products having stable resistivities in the range of 100 to 20,000 ohms per square.

3. Overview of the Process

The present method of preparing thermally stable high resistivity chromium silicide coatings involves one or two basic steps, depending whether or not the optional barrier layer is present. For brevity, the process will be described only in its two step variation.

The first step involves sputter depositing a first layer on the heat-stable substrate, preferably by magnetron sputtering of a dielectric (e.g., silicon) target. This sputtering is carried out in the presence of a sputtering gas such as argon, xenon, neon, krypton, or the like or mixtures thereof, and may, depending upon the exact dielectric desired, also employ a reactive gas such as oxygen or nitrogen.

The second step involves depositing a second layer over the first layer. This is carried out by reactive sputtering a $CrSi_2$ target in the presence of controlled amounts of nitrogen as reactive gas. These sputters can be carried out in a sheet coater if desired but in commercial practice will more likely be carried out using a continuous roll to roll coater of the type commercially sold by Leybold-Heraeus and others.

4. Deposition of the Initial Layer

The first layer is sputter deposited on a heat-stable substrate as has been described, such as by magnetron sputtering of a dielectric (silicon) cathode. This step is conducted in the presence of an inert sputtering gas such as argon. In the preferred case where silicon is the dielectric, this sputtering is carried out in the substantial absence of a reactive gas such as oxygen or nitrogen. When an oxidic dielectric layer is desired, a reactive gas containing an oxygen source can be added. The initial layer so provided is deposited to a thickness adequate to provide a continuous barrier between the substrate and the resistive layer. This thickness is as described above. The resistivity of the layer is very high, typically on the order of 10K-10Meg ohms per square.

5. Deposition of the Second Layer

After deposition of the relatively very high resistivity initial layer, a second layer as described above is provided thereover by reactive magnetron sputtering of a second target. This step is carried out in the presence of a mixture of nitrogen with a sputtering gas. The amount of nitrogen in the gaseous mixture is carefully controlled and may be varied depending on the ultimate product desired. Typically, the gaseous mixture contains 50-80 vol.% of sputtering gas such as argon and, correspondingly, 50-20 vol.% of nitrogen.

The $CrSi_2$ target should be at least about 99.5 wt.% pure, more preferably at least about 99.95 wt.% pure. Using a target of this purity substantially eliminates deposition of contaminating materials into the chromium silicide film which may destabilize the film or lower its overall resistivity. The target is typically formed by hot-pressing commercially available $CrSi_2$ powder into a solid block target. While the ratio of chromium to silicon in the target does not necessarily have to be exactly 2:1; the inventors herein have determined that optimum film properties are provided with a target that does have an approximate chromium-to-silicon ratio of 2:1.

The thickness of the second layer can be varied by controlling the sputter deposition parameters as is known in the art. For example, by altering the power to the cathodes (typically, in the range of 10 to 100 watts/in$^2$) or by altering the web speed (in the case of continuous coaters so as to vary the amount of time spent sputtering per unit area).

6. Optional Elements

Prior to deposition of either the "first" or "second" layers, the substrate may optionally be pretreated in one of several ways.

In production, the plastic substrate generally may be subjected to a preglow or glow discharge pretreatment to enhance the adherence of the dielectric film. This is carried out by subjecting the substrate to a glow discharge in the presence of an inert or reactive gas or mixtures thereof prior to any sputter deposit.

The product may also be provided with one or more underlayers, or "spacer" layers, between the "first" layer and the "second" layer. These spacer layers are preferably formed from temperature-stable dielectrics which are chemically compatible both with the first or barrier layer and with the chromium silicide film.

Similarly, after deposition of both the first and second layers of the chromium silicide film, one or more overlayers may be deposited to give the film added strength and abrasion resistance. These overlayers can be addition as well as the examples which follow are intended to illustrate and not limit the scope of the invention. Other aspects, advantages and modificatons within the scope of the invention will be apparent to those skilled in the art to which the invention pertains.

EXAMPLES 1-14

A laboratory-scale moving web D.C. magnetron sputterer was set up to apply chromium silicide to a moving plastic substrate. The substrate used was a thermally stable polyimide (DuPont Kapton). Runs were made in which the chromium silicide layer was deposited alone and with the barrier layer. The barrier, when used was a silicon barrier.

A 2¾"×15" hot-pressed $CrSi_2$ target (99.5+% pure) bonded to a molybdenum backing plate was used as the cathode for the chromium silicide deposition. The conditions for sputtering were a power density of 30 watts/square inch with 1 kW (maximum), and a target-to-substrate distance of 1 5/8". Baffles created a minienvironment within the overall sputtering chamber around the cathode so that various gases (both sputtering and reactive) could be added.

The silicon barrier layer was layed down using a 2¾ inch by 15 inch silicon target configured as the chromium silicide cathode. The cathode to substrate distance for this electrode was 3.125 inches. Again, the cathode was baffled to create a minienvironment for gas addition. Web line speed was varied as the principle mechanism for varying the thickness of the various layers.

Experiments were run with pure argon, argon mixed with nitrogen, and argon mixed with oxygen in the chromium silicide deposition minienvironment. The resistivities of the products produced under these various conditions were measured and the products were then placed in high temperature ovens to evaluate their stability with time/temperature exposure. These experiments are detailed in Table 1.

TABLE 1

| Example | Cr—Si$_2$ Gas Flows; cc/min | | Web Velocity mm/sec | Underlayer Si, Angstroms | Resistivity, ohms per square | Stability Drift at __ hours at °C. | | |
|---|---|---|---|---|---|---|---|---|
| | Ar | N$_2$ | | | | | | |
| 1 | 300 | 137 | 15 | 375 | 5580 | 1% | 32 | 190 |
| 2 | 300 | 137 | 10 | 375 | 3880 | 1% | 32 | 190 |
| 3 | 300 | 137 | 2 | 0 | 835 | 1% | — | 190 |
| 4 | 275 | 99 | 10 | 0 | 1230 | 2% | 56 | 190 |
| 5 | 300 | 137 | 5 | 0 | 2060 | <1% | 56 | 190 |
| 6 | 295 | 100 | 10 | 0 | 1230 | <1 | — | 190 |
| 7 | 245 | 100 | 10 | 0 | 710 | <1 | — | 190 |
| 8 | 300 | 135 | 5 | 0 | 1780 | <1 | 4 | 190 |
| 9 | 390 | 0 | 25 | 0 | 613 | 10% | 18 | 190 |
| 10 | 390 | 0 | 50 | 0 | 1320 | 25% | 18 | 190 |
| 11 | 300 | 138 | 10 | 375 | 4580 | 2% | 135 | 190 |
| 12 | 300 | 136 | 15 | 375 | 5700 | 0.25% | 120 | 190 |
| 13 | 300 | 146 | 5.0 | 1000 | 3070 | 3% | 93 | 190 |
| 14 | 300 | 147 | 2.5 | 1000 | 1730 | 1-2% | 91 | 190 | tional layers of plastic, but are typically dielectric materials similar to those used for the underlayers. In a particularly preferred embodiment, the chromium silicide film has a silicon overlayer. In order to best serve its purpose, this overlayer is preferably at least about 500 angstroms thick, and more preferably at least about 1000 angstroms thick.

It is to be understood that while the invention has been described in conjunction with the preferred specific embodiments thereof, that the foregoing descrip- In summary, as may be seen in Table 1, these experiments showed:

(1) that a silicon underlayer helps achieve uniform, stable, high resistivity chromium silicide films–apparently by providing a barrier against water release from the substrate during subsequent chromium silicide deposition;

(2) that addition of nitrogen leads to improved chromium silicide deposition and to thermally stable resistor films having resistances in the range of at least about 100 ohms per square and commonly above 2000 ohms per square.

EXAMPLE 15

When experiments such as those shown in Examples 1-14 were attempted with even small additions (5% or less) of oxygen, arcing occurred which brought about termination of the runs.

EXAMPLE 16

A chrome silicide film is prepared by the general method of examples 1-14. A 1000 angstrom silicon underlayer is applied to Kapton. Then a 500 angstrom layer of chromium silicide is added without $N_2$ addition. This film has a resistivity of about 85 ohms per square.

Nitrogen is gradually added and the resistivity increases to 100 ohms per square and beyond. The 95-105 ohms per square material is thermally stable, while higher resistivity material is less stable.

When this is repeated using 92 ohms per square base material, again stable films are in the 100 ohms per square region.

EXAMPLE 17

When the experiments of Example 16 are repeated using chromium silicide films slightly thicker than 500 angstoms, the level of nitridation which gave stable films occurs at resistances in the 125-150 ohms per square region.

EXAMPLE 18

When the experiments of Example 16 are repeated using a 2000-2500 angstrom chromium silicide film. Without nitrogen addition, the chromium silicide layer has a resistivity of about 18-22 ohms per square. Varying degrees of nitridation are carried out and it is found that stable films have a resistivity in the range of 775-850 ohms per square.

EXAMPLE 19

When the experiments of Example 16 are repeated using a 4000-5000 angstrom chromium silicide film. Without nitrogen addition, the chromium silicide layer has a resistivity of about 9-10 ohms per square. Varying degrees of nitridation are carried out and it is found that stable films have a resistivity in the range of over 1000 ohms per square.

What is claimed is:

1. A process for preparing a thermally stable high resistivity chromium silicide film, comprising the step of:
    depositing on a heat-stable flexible substrate by magnetron sputtering, in the presence of a gaseous mixture consisting essentially of 50-80 volume % of an inert gas selected from argon, xenon, neon, krypton, and mixtures thereof and, correspondingly, 50-20 volume % of nitrogen, a 300 to 6000 angstrom layer comprising chromium silicide, said volume % of nitrogen being selected to give a thermally stable film at the layer thickness selected.

2. The process of claim 1, wherein said heat-stable flexible substrate is a plastic support.

3. The process of claim 2, wherein said plastic support is a polyimide.

4. The process of claim 1, wherein said heatstable substrate is coated, prior to deposition of the chromium silicide layer, with an underlayer comprising a chemically compatible, heat-stable barrier material.

5. The process of claim 4, wherein said barrier material is silicon.

6. The process of claim 4, wherein said barrier material is indium-tin oxide.

7. The process of claim 4, wherein said underlayer has a thickness of at least about 100 angstroms.

8. The process of claim 1 wherein said inert gas is argon.

9. A process for preparing a thermally stable high resistivity chromium silicide film, comprising the steps of:
    depositing a first layer of dielectric on a heat-stable flexible substrate by sputtering of a dielectric target and
    depositing by magnetron sputtering on said first layer, in the presence of a gaseous mixture consisting essentially of 50-80 volume % of an inert gas selected from argon, xenon, neon, krypton, and mixtures thereof and, correspondingly, 50-20 volume % of nitrogen, a second layer comprising chromium silicide, said volume % of nitrogen being selected to give a thermally stable film at the thickness selected.

10. The process of claim 9, wherein said heatstable flexible substrate is a plastic support.

11. The process of claim 10, wherein said plastic support is a polyimide.

12. The process of claim 9, wherein said first layer is deposited in the presence of a controlled amount of an inert gas.

13. The process of claim 12, wherein said inert gas present during the deposit of the first and second layers is argon.

14. The process of claim 9, wherein said heat-stable substrate is subjected to a preglow discharge prior to deposition of said first layer.

15. The process of claim 9, wherein the target sputtered to create the second layer comprises chromium silicide in at least about 99.5 wt.% purity.

16. The process of claim 4, further including depositing an overlayer on the chromium silicide layer, said overlayer comprising a chemically compatible, heat-stable barrier material.

* * * * *